United States Patent
Kwean et al.

(10) Patent No.: US 7,001,692 B2
(45) Date of Patent: Feb. 21, 2006

(54) METHOD OF FORMING A MASK HAVING NITRIDE FILM

(75) Inventors: Sung-Un Kwean, Gyeonggi-do (KR); Jae-Seung Hwang, Suwon (KR)

(73) Assignee: Samsung Electronics, Co., Ltd., (KR)

( * ) Notice: Subject to any disclaimer, the term of this patent is extended or adjusted under 35 U.S.C. 154(b) by 198 days.

(21) Appl. No.: 10/307,850

(22) Filed: Dec. 2, 2002

(65) Prior Publication Data

US 2003/0114003 A1   Jun. 19, 2003

(30) Foreign Application Priority Data

Dec. 17, 2001 (KR) .............................. 2001-80174

(51) Int. Cl.
  *G03F 9/00* (2006.01)
  *G03C 5/00* (2006.01)
(52) U.S. Cl. .................... 430/5; 430/313; 430/323
(58) Field of Classification Search ............. 430/5, 430/313, 323
See application file for complete search history.

(56) References Cited

U.S. PATENT DOCUMENTS 6,020,269 A * 2/2000 Wang et al. ................ 438/717

* cited by examiner

*Primary Examiner*—Saleha R. Mohamedulla
(74) *Attorney, Agent, or Firm*—Mills & Onello, LLP

(57) ABSTRACT

A method of forming a mask comprises forming a mask layer including nitrogen, forming a photoresist pattern on the mask layer and etching the mask layer using a mixes gas including a first gas adapted for etching the mask layer and a second gas for increasing selectivity of the photoresist pattern, thereby forming a hard mask. In this manner, selectivity of the photoresist is improved while a high etching ratio of the nitride layer is maintained when forming a hard mask.

37 Claims, 8 Drawing Sheets

METHOD OF FORMING A MASK HAVING NITRIDE FILM

BACKGROUND OF THE INVENTION

1. Field of the invention

The present invention relates to a method of forming a hard mask, and more particularly, to a method of forming a hard mask having a nitride film.

2. Description of Related Art

A design rule of a semiconductor memory device is on an ever-decreasing trend. Due to the ever-narrowing design rule, the thickness of a photoresist film is unavoidably reduced in the case of a photolithography process. Such decrease in the thickness of the photoresist film causes inevitable erosion of a photolithographic mask since the selectivity of the photoresist film is limited during etching of a multi-layered mask. Such erosion of the mask worsens the resulting thickness variation of the mask following a trench etching process and a subsequent chemical mechanical polishing (CMP) process. Accordingly, there is a need for improving the selectivity of the photoresist film in a mask etching process.

FIGS. 1A to 1F are cross-sectional views illustrating a process of forming a conventional hard mask having a nitride film, and a related process of forming a trench.

Figure 1A:
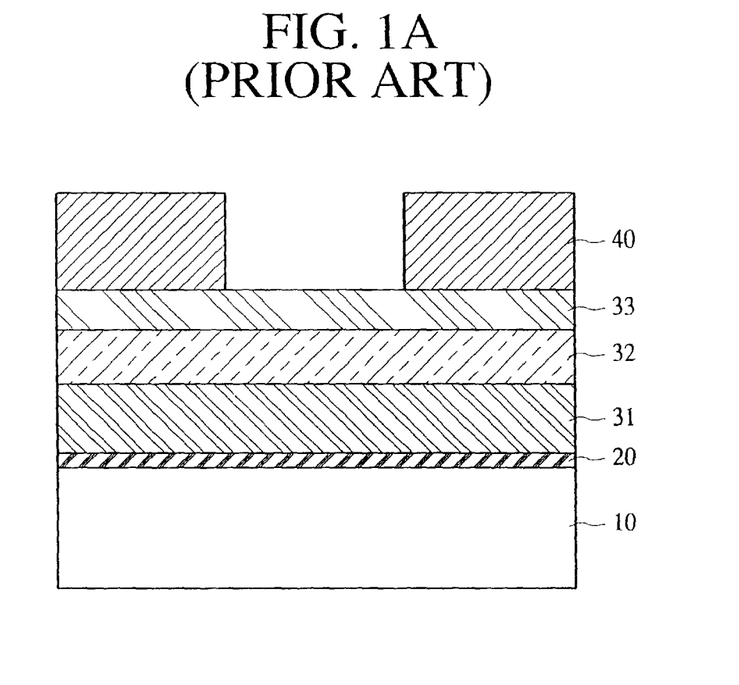
FIGS. 1A to 1F are cross-sectional views illustrating a process of forming a conventional hard mask having a nitride film and a process of forming a trench according to the conventional approach.
Figure 1B:
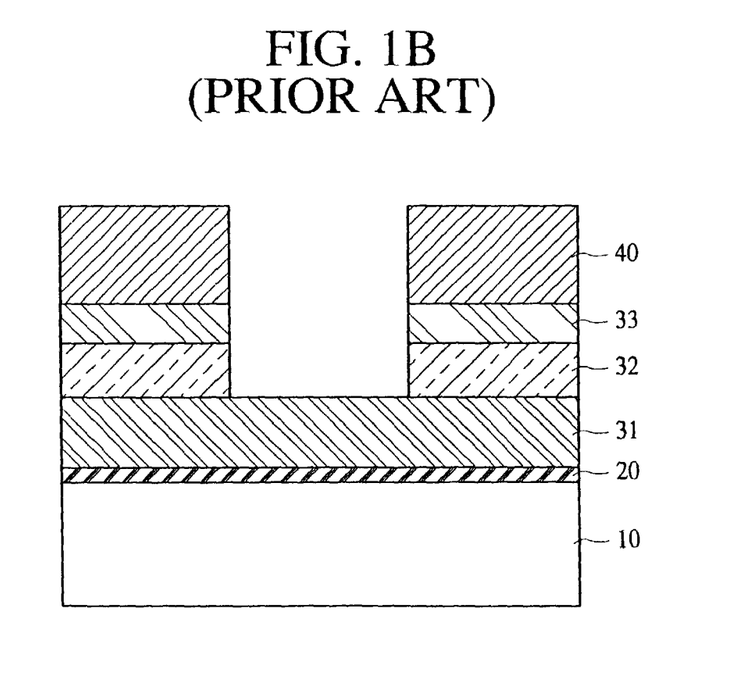
Figure 1C:
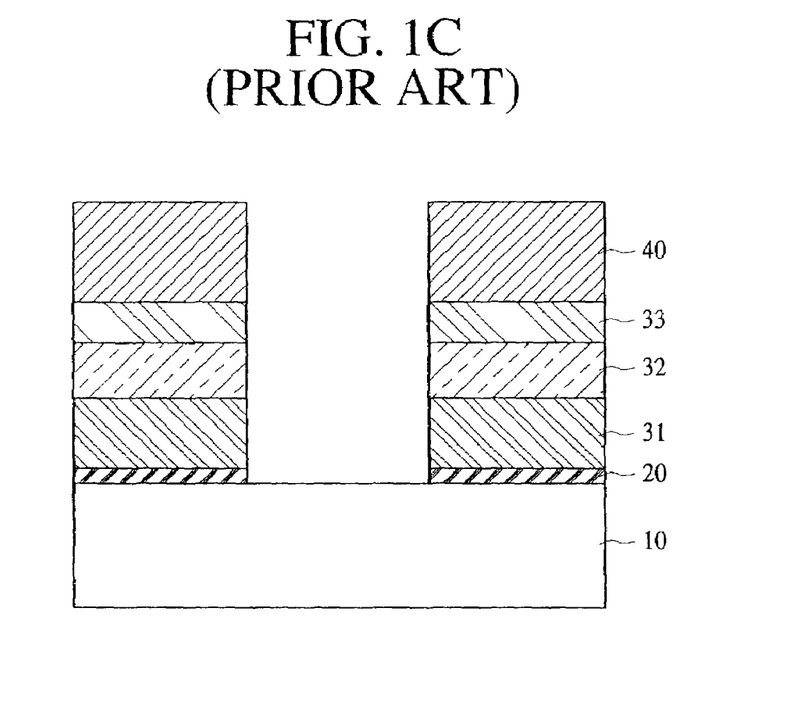

Referring to FIG. 1A, a pad oxide layer 20 is formed on a semiconductor substrate 10 comprising silicon. A mask layer is formed on the pad oxide layer 20. The mask layer includes a nitride layer 31 comprising SiN, an oxide layer 32 comprising $SiO_2$, and a nitrogen-oxidation layer 33 comprising SiON, which are sequentially deposited on the pad oxide layer 20. The oxide layer 32 comprises a high temperature oxide layer. A photoresist pattern 40 is formed on the mask layer. In one example, the photoresist pattern has a thickness of 0.30 μm.

Thereafter, the mask layer is etched by dual, separate etching processes. In more detail, referring to FIG. 1B, the oxide layer 32 and the nitrogen-oxidation layer 33 are etched using the photoresist pattern 40 as a mask. Following this, referring to FIG. 1C, the nitride layer 31 is then etched.

Figure 1D:
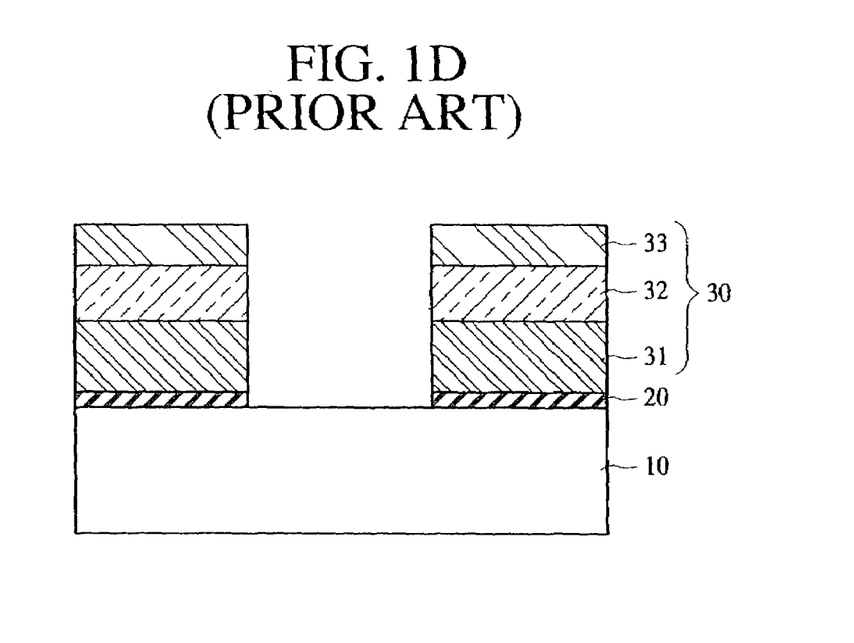

Referring to FIG. 1D, the photoresist pattern 40 is removed by an ashing process and a strip process, thereby forming a multi-layered hard mask 30.

Figure 1E:
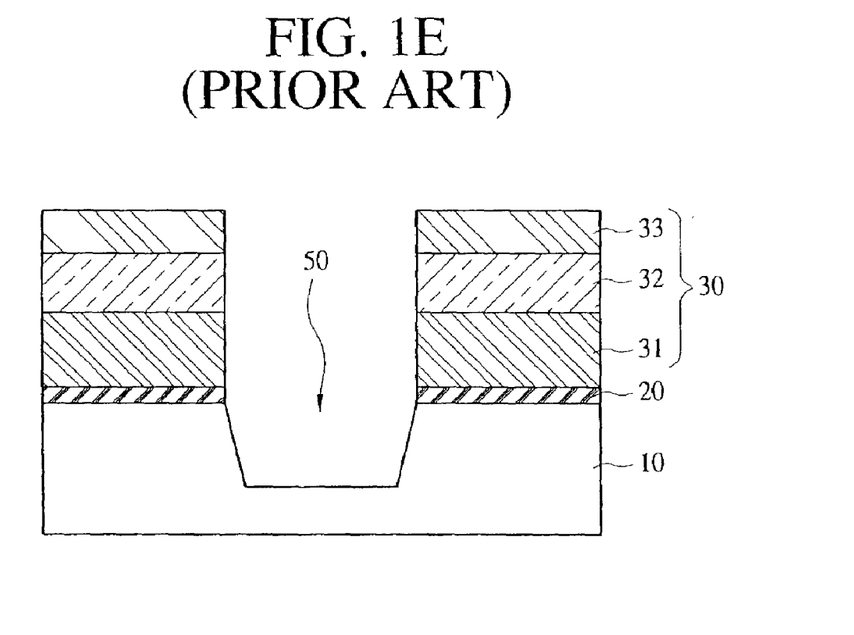

Referring to FIG. 1E, the hard mask 30 is used to expose a portion of the semiconductor substrate 10.

Figure 1F:
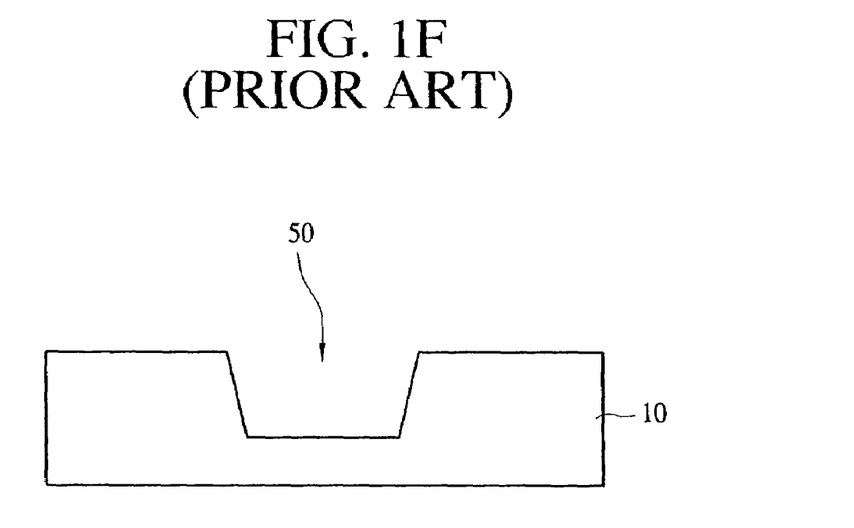

Referring to FIG. 1F, the remaining portions of the pad oxide layer 20 and the hard mask 30 are removed, thereby forming a trench 50 in the substrate 10.

Thereafter, an oxide layer is filled in the trench 50 (not shown), and then a CMP process is performed to form an isolation film in the trench which isolates an active region formed on the substrate.

The mask etching process described above is performed using a mixing gas of $CHF_3/CF_4/Ar/O_2$. In this case, the ratio of the etching rate of the photoresist film to the etching rate of the mask layer is on the order of 1:1.5. In the case of a semiconductor device having a narrow design rule, due to a poor selectivity of the photoresist film, a problem occurs in that when the photoresist film is etched away, a portion of the hard mask is eroded.

Figure 2A:
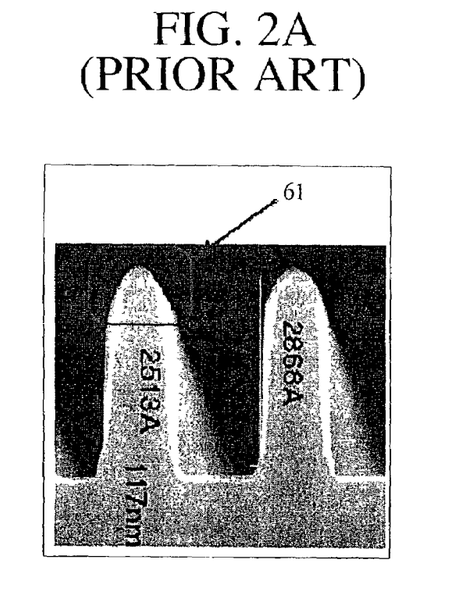
FIGS. 2A and 2B are photographs illustrating a conventional semiconductor device following conventional mask etching and trench formation processes.
Figure 2B:
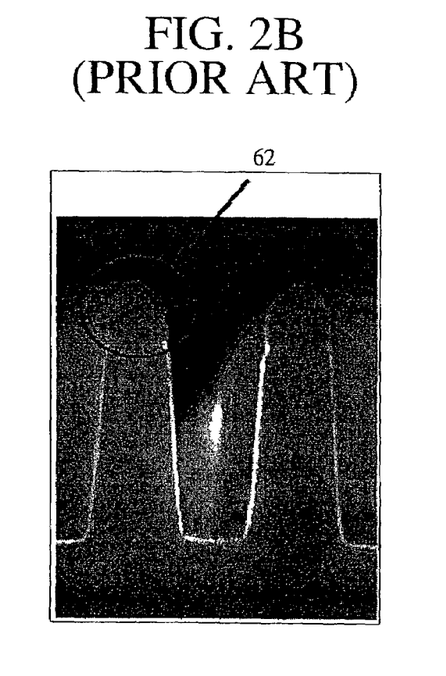

Referring to FIG. 2A, at this stage, the photoresist film is removed from the hard mask, and the hard mask is partially removed as well 61. Further, as shown in FIG. 2B, following the trench etching process, the hard mask is eroded even further 62.

In addition, since selectivity of the photoresist film (or the ratio of the etching rate of the hard mask to the etching rate of the photoresist film) is poor, the nitride layer 31, the oxide layer 32 and the nitrogen-oxidation layer 33 are etched using different etching equipment, respectively, as described above, thereby reducing throughput of the process.

Such decreasing of the thickness of the photoresist film resulting from a narrow design rule greatly affects the trench etching process for isolating an active region and the etching process of a gate polysilicon layer of a semiconductor device having a deep trench and a multi-layered structure, such as found in SRAM and non-volatile memory (NVM) devices.

SUMMARY OF THE INVENTION

To overcome the limitations described above, it is an object of the present invention to provide a method of forming a mask which can improve the selectivity of the photoresist film.

It is another object of the present invention to provide a method of forming a mask which can improve process throughput.

In one aspect, the present invention is directed to a method of forming a mask. A mask layer comprising nitrogen is formed. A photoresist pattern is formed on the mask layer. The mask layer is etched using a mixed gas comprising a first gas adapted for etching the mask layer and a second gas adapted for increasing selectivity of the photoresist pattern, thereby forming a hard mask.

The mask layer may comprise a single-layered structure including SiON or SiN, or may comprise a multi-layered structure including at least one of SiON and SiN. In one example, the multi-layered structure includes an SiN layer, an $SiO_2$ layer on the SiN layer, and an SiON layer on the $SiO_2$ layer. The multi-layered mask layer is etched in situ.

The first gas may include $CH_mF_n$, wherein m and n are one of 1, 2 and 3, respectively, or, optionally $CH_mF_n/O_2/Ar$, or, optionally, $CH_mF_n/CF_4/O_2/Ar$. The $CH_mF_n$ may include one of $CHF_3$ and $CH_2F_2$.

The second gas for increasing the selectivity of the photoresist pattern may comprise CxFy where x and y are selected such that a ratio of x/y is 0.5 or greater. The $C_xF_y$ may include one of $C_5F_8$, $C_4F_6$, and $C_3F_6$. The flow rate of the $C_xF_y$ is in a range between 1 standard cubic centimeters per minute (referred to as "sccm") and 10 sccm.

In another aspect, the present invention is directed to a method of forming a mask. A first layer comprising nitrogen is formed on a substrate. The first layer comprising nitrogen is etched using a mixed gas comprising a first gas adapted for etching the first layer and a second gas for quickening the etching of the first layer comprising nitrogen.

The first layer may comprise a single-layered structure including SiON or SiN, or may comprise a multi-layered structure including at least one of SiON and SiN. In one example, the multi-layered structure includes an SiN layer, an $SiO_2$ layer on the SiN layer, and an SiON layer on the $SiO_2$ layer. The multi-layered structure is etched in situ.

The first gas may include $CH_mF_n$, wherein m and n are one of 1, 2 and 3, respectively, or, optionally $CH_mF_n/O_2/Ar$, or, optionally, $CH_mF_n/CF_4/O_2/Ar$. The $CH_mF_n$ may include one of $CHF_3$ and $CH_2F_2$.

The second gas for increasing the selectivity of the photoresist pattern may comprise $C_xF_y$ where x and y are selected such that a ratio of x/y is 0.5 or greater. The $C_xF_y$ may include one of $C_5F_8$, $C_4F_6$, and $C_3F_6$. The flow rate of the $C_xF_y$ is in a range between 1 sccm and 10 sccm.

The mixed gas may further include CO gas to further improve the selectivity of the photoresist pattern. The flow rate of the CO gas is in a range between 10 sccm and 200 sccm.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, an example of which is illustrated in the accompanying drawings.

FIGS. 3A to 3E are cross-sectional views illustrating a process of forming a hard mask and a process of forming a trench according to the present invention.

Figure 3A:
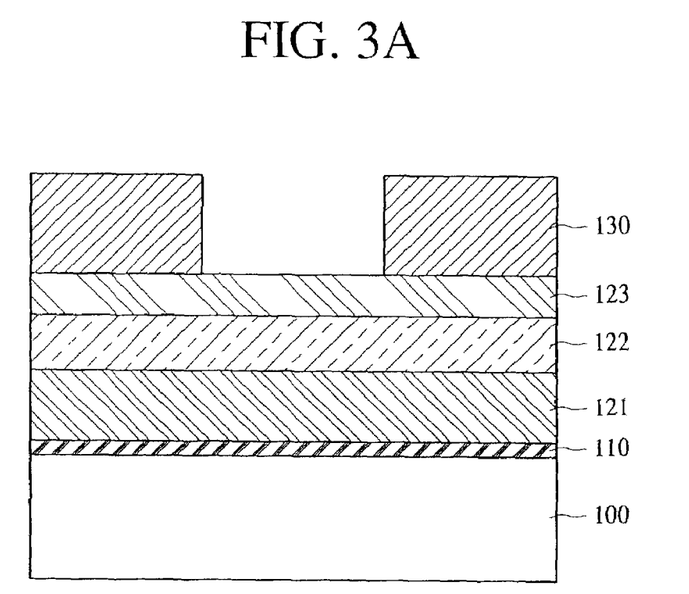
FIGS. 3A to 3E are cross-sectional views illustrating a process of forming a hard mask and a process of forming a trench according to the present invention.

Referring to FIG. 3A, a pad oxide layer 110 is formed on a semiconductor substrate 100. A mask layer is formed on the pad oxide layer 110. A photoresist film is coated on the mask layer, for example to a thickness of 0.30 $\mu$m, and then patterned to form a photoresist pattern 130.

The mask layer includes one or more layers including a nitride layer such as a silicone nitride layer (SiN) or a nitrogen-oxidation layer (SiON). The mask layer of FIG. 3A includes, for example, a nitride layer 121, an oxide layer 122, and a nitrogenoxidation layer 123 which are sequentially stacked on the pad oxide layer.

Figure 3B:
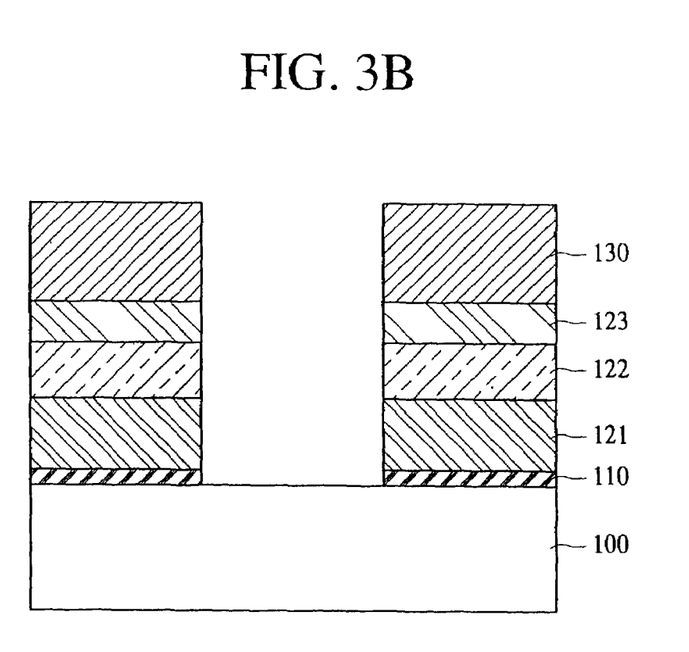

Referring to FIG. 3B, the mask layer including the nitride layer 121, the oxide layer 122 and the nitrogen-oxidation layer 123 is etched in situ, along with the pad oxide layer 110. Here, the process of etching the mask layer is performed by using a mixed gas prepared by adding a gas that improves the selectivity of the photoresist film to an etching gas selected for etching the mask layer. For example, the mixed gas is prepared by adding $C_xF_y$ (for improving the selectivity of the photoresist film) to $CH_mF_n$ (where m and n=1, 2, 3, for example) or $CH_mF_n/CH_4/Ar/O_2$ (where m and n=1, 2, 3, for example) which is a common etching gas. This improves the etching rate of the nitride layer, while simultaneously improving a selectivity of the photoresist film.

In one example, $CH_mF_n$ includes $CHF_3$ and $CH_2F_2$. The added gas $C_xF_y$ includes, for example, a gas having a ratio such that x/y is 0.5 or greater, such as $C_5F_8$, $C_4F_6$, and $C_3F_6$. $CH_mF_n$ preferably has a flow rate of 10 to 100 sccm. Ar has a flow rate of 200 sccm to 500 sccm. $O_2$ has a flow rate of 10 sccm to 30 sccm. $C_xF_y$ has a flow rate of 1 sccm to 10 sccm.

In general, when the gas $C_xF_y$ having a ratio of x/y of 0.5 or greater is used alone, that is, independently of the etching gas, the gas $C_xF_y$ tends to reduce or stop etching of the nitride layer 121 in the case where the nitride layer 121 is arranged under the oxide layer 122.

However, when the added gas $C_xF_y$ is mixed with $CH_mF_n$, as in the present invention, the mixed etching gas demonstrates a high etching rate of the nitride layer and a high selectivity to the photoresist film. For example, the etching rate of the nitride layer as compared to the etching rate of the photoresist film is on the order of 3.31:1 to 5:1.

In order to additionally improve the etching rate of the nitride layer and the selectivity of the photoresist film, CO gas can be added to the mixed etching gas. In this example the CO gas has a flow rate of 10 sccm to 200 sccm.

Consequently, since a high etching rate of the nitride layer and a high selectivity to the photoresist film can be obtained in this embodiment of the present invention, the multi-layered mask layer including the nitride layer 121 can be etched in situ, as shown in FIG. 3B, thereby improving process throughput.

The mixed etching gas according to the present invention shows a high selectivity to an ArF photoresist film.

Figure 3C:
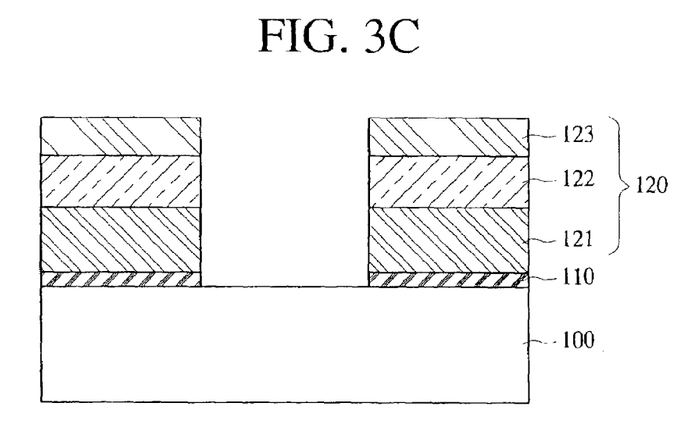

Subsequently, referring to FIG. 3C, the photoresist pattern 130 is removed by an ashing process and a strip process, thereby forming a multi-layered hard mask 120.

Figure 3D:
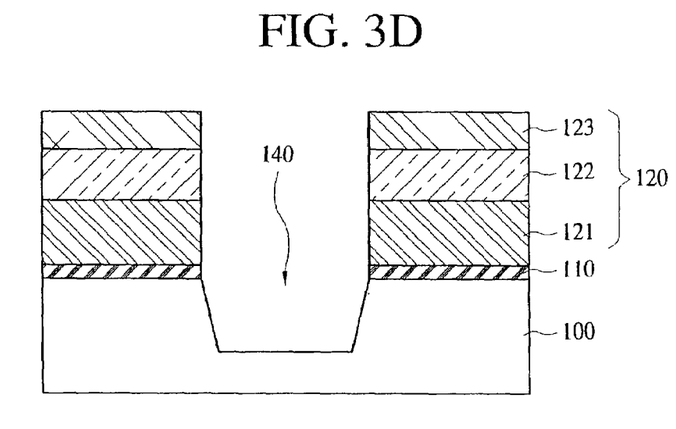

Referring to FIG. 3D, the exposed portion of the semiconductor substrate 100 is etched using the multi-layered hard mask 120.

Figure 3E:
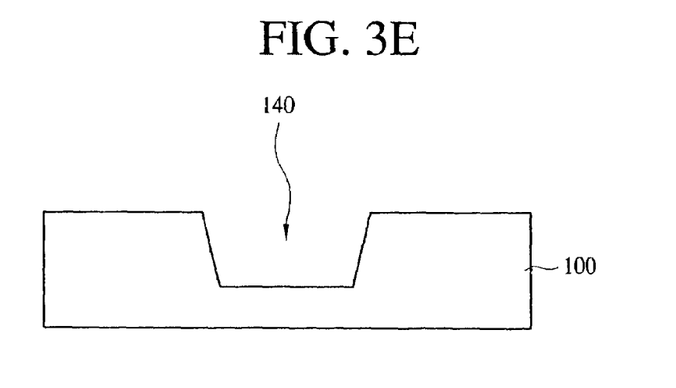

Referring to FIG. 3E, the remaining portions of the pad oxide layer 110 and the multi-layered hard mask 120 are removed, thereby forming a trench 140.

Thereafter, an oxide layer (not shown) is filled in the trench 140, and then a CMP process is performed, thereby forming an isolation film in the trench which isolates an active region.

Figure 4A:
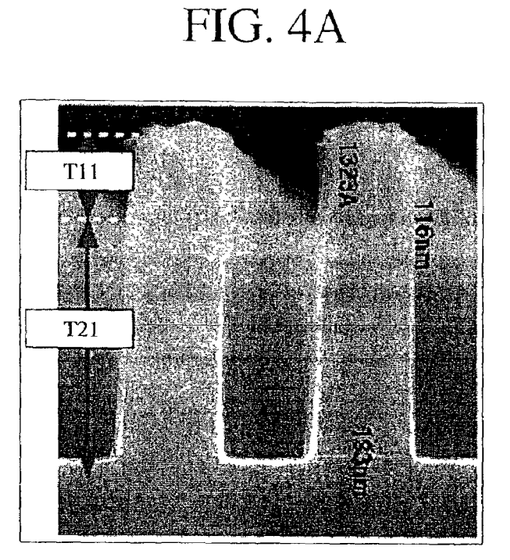
FIGS. 4A and 4B are photographs illustrating a semiconductor device following a mask etching process and a trench etching process according to the present invention.
Figure 4B:
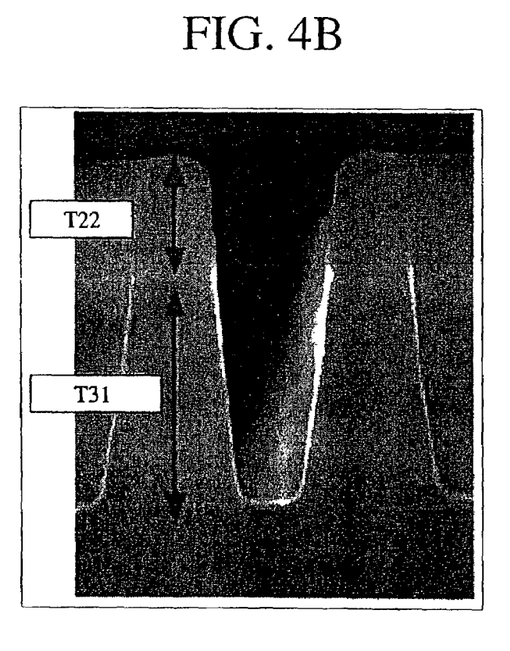

FIGS. 4A and 4B are photographs illustrating a semiconductor device after a mask etching process and a trench etching process.

As shown in FIG. 4A, when the multi-layered mask layer is etched under the etching condition according to the present invention, the photoresist film remains on the hard mask layer at a thickness of T11 (e.g., 1312 Å).

The etching rate of the hard mask layer under conventional etching conditions is 2200 Å/min, and the selectivity of the photoresist film is 1.5:1, whereas the etching rate of the hard mask layer under etching conditions of the present invention is 3500 Å/min, and the selectivity of the photoresist film is 3.31:1. Here, the photoresist film and the hard mask layer have a thickness of 3000 Å, respectively.

According to the method of forming the hard mask layer of the present invention, the hard mask layer and photoresist film remain "as is", at a thickness of 3000 Å, i.e., to a thickness of T21+T11, following the mask etching process. In the conventional approach shown in FIG. 2A, the photoresist film is entirely removed, and the hard mask layer 61 is partially eroded.

Referring to FIG. 4B, when the trench etching process is performed using the hard mask layer formed by the mask etching layer of FIG. 4A in accordance with the present invention, the hard mask layer remains at a thickness of T22, so that a trench having an excellent profile of a desired depth T31 can be obtained.

Although the methods of the present invention are described above with reference, by way of example, to the a trenching etching process using a hard mask, the invention can be equally well applied to other semiconductor processes, for example, a gate polysilicon etching process.

Figure 5:
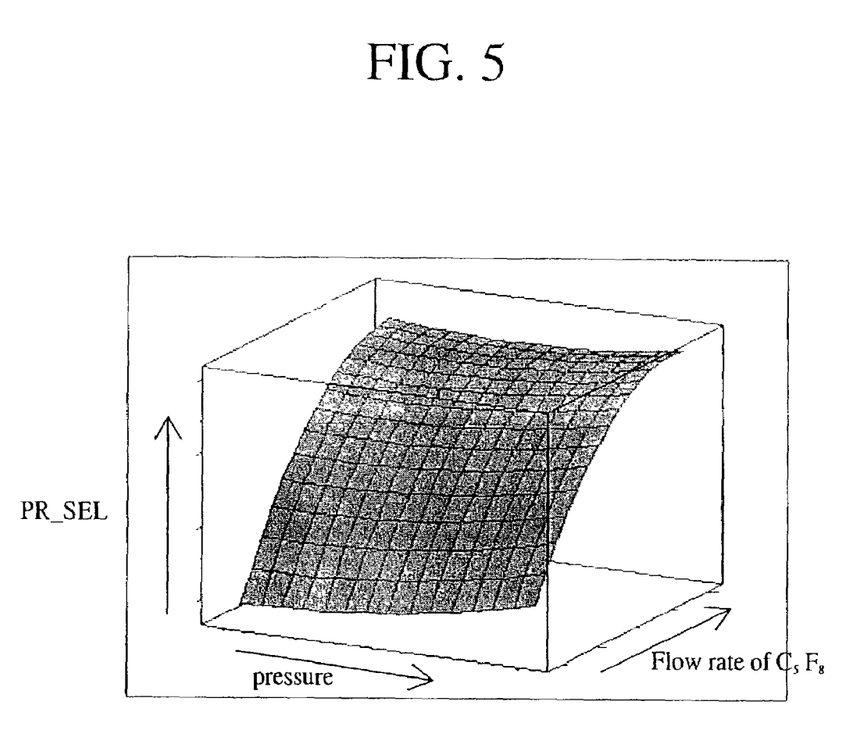

FIG. 5 illustrates the selectivity PR_SEL of the photoresist film according in response to the flow rate of $C_5F_8$ gas. As shown in FIG. 5, as the flow rate of $C_5F_8$ gas is increased, the selectivity PR_SEL of the photoresist film is increased.

As described above, the method of forming the hard mask according to the present invention can improve an etching rate of the nitride layer while simultaneously improving a selectivity of the photoresist film, resulting in an improvement in process throughput.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a mask, comprising:
    forming a mask layer comprising nitrogen;
    forming a photoresist pattern on the mask layer; and
    simultaneously etching the mask layer and increasing the selectivity of the photoresist pattern by treating the mask layer with a gas mixture containing both a first gas and a second gas, wherein the first gas has the general chemical formula $CH_mF_n$, wherein m and n are one of 1, 2, and 3, and the second gas has the general chemical formula $C_xF_y$ where x and y are selected such that a ratio of x/y is 0.5 or greater, thereby forming a hard mask.

2. The method of claim 1, wherein the mask layer comprises a single-layered structure including SiON or SiN.

3. The method of claim 1, wherein the mask layer comprises a multi-layered structure including at least one of SiON and SiN.

4. The method of claim 3, wherein the mask layer comprises a layered structure including an SiN layer, an $SiO_2$ layer on the SiN layer, and an SiON layer on the $SiO_2$ layer.

5. The method of claim 3, wherein the multi-layered mask layer is etched in situ.

6. The method of claim 1, wherein the first gas comprises $CH_mF_n/O_2/Ar$.

7. The method of claim 1, wherein the first gas comprises $CH_mF_n/CF_4/O_2/Ar$.

8. The method of claim 1, wherein $CH_mF_n$ includes one of $CHF_3$ and $CH_2F_2$.

9. The method of claim 1, wherein $C_xF_y$ includes one of $C_5F_8$, $C_4F_6$, and $C_3F_6$.

10. The method of claim 1, wherein a flow rate of the $C_xF_y$ is in a range between 1 sccm and 10 sccm.

11. The method of claim 1, wherein the mixed gas further includes CO gas to further improve the selectivity of the photoresist pattern.

12. The method of claim 11, wherein a flow rate of the CO gas is in a range between 10 sccm and 200 sccm.

13. A method of forming a mask, comprising:
    forming a first layer comprising nitride on a substrate;
    forming a second layer comprising oxide on the substrate; and
    simultaneously etching in situ the first layer and the second layer and quickening the etching of the first layer by treating the first layer and the second layer with a gas mixture containing both a first gas and a second gas, the first gas adapted for etching the first layer and the second layer, and the second gas for quickening the etching of the first layer.

14. The method of claim 13, wherein the first layer and the second layer in combination comprise a multi-layered structure including at least one of SiON and SiN.

15. The method of claim 14, wherein the multi-layered structure comprises a layered structure including an SiN layer, an $SiO_2$ layer on the SiN layer, and an SiON layer on the $SiO_2$ layer.

16. The method of claim 13, wherein the first gas includes $CH_mF_n$, where m and n are one of 1, 2 and 3, respectively.

17. The method of claim 16, wherein the first gas comprises $CH_mF_n/O_2/Ar$.

18. The method of claim 16, wherein the first gas comprises $CH_mF_n/CF_4/O_2/Ar$.

19. The method of claim 16, wherein $CH_mF_n$ includes one of $CHF_3$ and $CH_2F_2$.

20. The method of claim 13, wherein the second gas for quickening etching of the first layer comprises $C_xF_y$, wherein x and y are selected such that a ratio of x/y is 0.5 or greater.

21. The method of claim 20, wherein C F includes one of $C_5F_8$, $C_4F_6$, and $C_3F_6$.

22. The method of claim 21, wherein a flow rate of the $C_xF_y$ is in a range between 1 sccm and 10 sccm.

23. The method of claim 13, wherein the mixed gas further includes CO gas to further quicken the etching of the first layer.

24. The method of claim 23, wherein a flow rate of the CO gas is in a range between 10 sccm and 200 sccm.

25. The method of claim 1, further comprising etching a portion of a semiconductor substrate using the hard mask.

26. A method of forming a mask, comprising:
    forming a mask layer comprising a multi-layered structure including a nitride layer and an oxide layer;
    forming a photoresist pattern on the mask layer; and
    simultaneously etching in situ both the nitride layer and the oxide layer of the multi-layered mask layer and increasing the selectivity of the photoresist pattern by treating the mask layer with a gas mixture containing both a first gas and a second gas, the first gas adapted for etching the mask layer and the second gas adapted for increasing the selectivity of the photoresist pattern, thereby forming a hard mask.

27. The method of claim 26, wherein the multi-layered mask layer includes at least one of SiON and SiN.

28. The method of claim 27, wherein the multi-layered mask layer includes an SiN layer, an $SiO_2$ layer on the SiN layer, and an SiON layer on the $SiO_2$ layer.

29. The method of claim 26, wherein the first gas includes $CH_mF_n$, wherein m and n are one of 1, 2 and 3, respectively.

30. The method of claim 29, wherein the first gas comprises $CH_mF_n/O_2/Ar$.

31. The method of claim 29, wherein the first gas comprises $CH_mF_n/CF_4/O_2/Ar$.

32. The method of claim 29, wherein $CH_mF_n$ includes one of $CHF_3$ and $CH_2F_2$.

33. The method of claim 26, wherein the second gas for increasing the selectivity of the photoresist pattern comprises $C_xF_y$, where x and y are selected such that a ratio of x/y is 0.5 or greater.

34. The method of claim 33, wherein $C_xF_y$ includes one of $C_5F_8$, $C_4F_6$, and $C_3F_6$.

35. The method of claim 33, wherein a flow rate of the $C_xF_y$ is in a range between 1 sccm and 10 sccm.

36. The method of claim 26, wherein the mixed gas further includes CO gas to further improve the selectivity of the photoresist pattern.

37. The method of claim 36, wherein a flow rate of the CO gas is in a range between 10 sccm and 200 sccm.

* * * * *

UNITED STATES PATENT AND TRADEMARK OFFICE
CERTIFICATE OF CORRECTION

| | | |
|---|---|---|
| PATENT NO. | : 7,001,692 B2 | Page 1 of 1 |
| APPLICATION NO. | : 10/307850 | |
| DATED | : February 21, 2006 | |
| INVENTOR(S) | : Sung-Un Kwean and Jae-Seung Hwang | |

It is certified that error appears in the above-identified patent and that said Letters Patent is hereby corrected as shown below:

At Column 3, Line 25, insert the following paragraph --FIG. 5 is a graphic representation of selectivity of a photoresist film in response to flow rate of $C_5F_8$ gas.--

At Column 6, Claim 21, Line 17, insert --$_x$-- after "C".

At Column 6, Claim 21, Line 17, insert --$_y$-- after "F".

Signed and Sealed this

Eleventh Day of July, 2006

JON W. DUDAS
*Director of the United States Patent and Trademark Office*